(12) United States Patent
Atesoglu (10) Patent No.: US 7,804,348 B1
(45) Date of Patent: Sep. 28, 2010

(54) CLOCK DATA RECOVERY WITH HIGH SPEED LEVEL SHIFT

(75) Inventor: Ali Atesoglu, Milpitas, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 12/603,231

(22) Filed: Oct. 21, 2009

Related U.S. Application Data (62) Division of application No. 11/825,164, filed on Jul. 4, 2007, now Pat. No. 7,626,440.

(51) Int. Cl.
*G06F 1/04* (2006.01)
(52) U.S. Cl. ........................... 327/292; 327/156
(58) Field of Classification Search ............... 327/147, 327/148, 156, 157, 292, 318, 319, 333
See application file for complete search history.

(56) References Cited

U.S. PATENT DOCUMENTS

| | | | |
|---|---|---|---|
| 5,378,943 A | 1/1995 | Dennard | |
| 5,834,948 A | 11/1998 | Yoshizaki et al. | |
| 5,892,371 A | 4/1999 | Maley | |
| 5,994,968 A * | 11/1999 | Iravani et al. | 331/57 |
| 6,121,816 A * | 9/2000 | Tonks et al. | 327/296 |
| 6,429,716 B1 | 8/2002 | Drapkin et al. | |
| 6,487,687 B1 | 11/2002 | Blake et al. | |
| 6,501,306 B1 | 12/2002 | Kim et al. | |
| 6,515,532 B2 | 2/2003 | Jinzai | |
| 6,801,064 B1 | 10/2004 | Hunt et al. | |
| 7,112,995 B2 | 9/2006 | Mentze et al. | |
| 7,215,146 B2 | 5/2007 | Khan | |
| 7,352,229 B1 | 4/2008 | Mei et al. | |

(Continued)

OTHER PUBLICATIONS

Degregorio. K. et al. "Rad-Hard Reconfigurable Bi-Directional Level Shifter (ReBiLS) for NASA Space Applications in the Flexfet™ 0.18 μm SOI CMOS Technology." 12th NASA Symposium on VLSI Design, Oct. 2005, Coeur d'Alene, Idaho.

(Continued)

*Primary Examiner*—Jeffrey S Zweizig
(74) *Attorney, Agent, or Firm*—Mauriel Kapouytian & Treffert LLP; Michael Mauriel (57) ABSTRACT

Clock data recovery circuitry with a high speed level shifting circuits and methods are disclosed. One embodiment provides clock data recover with a high speed level shifting circuit that uses an input signal to generate two intermediate signals and uses the intermediate signals to generate an output signal such that voltage stress on individual devices within the level shifting circuit is minimized. In one embodiment, the level shifter includes a first driver and second driver coupled in parallel to provide intermediate signals to an output driver. In a particular aspect, individual transistors of the output driver are subject to voltage stresses that are less than the peak-to-peak amplitude of the output signal. In one embodiment, the first driver includes an n-channel metal oxide semiconductor ("NMOS") cascode circuit, the second driver includes a p-channel metal oxide semiconductor ("PMOS") cascode circuit, and the output driver includes a complementary metal oxide conductor ("CMOS") inverter stage. In one embodiment, the level shifter is implemented in an integrated circuit characterized by 45-nanometer technology. In another embodiment, the level shifter is implemented in an integrated circuit characterized by 65-nanometer technology.

6 Claims, 6 Drawing Sheets

U.S. PATENT DOCUMENTS 7,355,445 B2 4/2008 Kimura
7,372,341 B2 5/2008 Nagarakanti et al.

OTHER PUBLICATIONS

Han, Y.C. et al. "A Dual band CMOS VCO with a Balanced Duty Cycle Buffer." GLSVLSI'03, Apr. 2003. p. 277-280.

Hass, K. Joe and Cox, David F. "Level Shifting Interfaces for Low Voltage Logic." 9th NASA Symposium on VLSI Design, 2000. p. 3.1.1-3.1.7.

Pan, D. et al. "A Low Voltage to High Voltage Level Shifter Circuit for MEMS Application." University/Government/Industry Microelectronics Symposium, 2003.

Huang, Zhengrong et al. "Robust Design of a Dynamically Controlled Low-Power Level-up Shifter Operating up to 300V," IEEE, 2004.

* cited by examiner

CLOCK DATA RECOVERY WITH HIGH SPEED LEVEL SHIFT

CROSS REFERENCE TO RELATED APPLICATION

This application is a Divisional of U.S. application Ser. No. 11/825,164, filed Jul. 4, 2007, now U.S. Pat. No. 7,626,440, hereby incorporated by reference.

BACKGROUND

The present invention relates to clock data recovery circuitry including level shifting circuits.

Integrated circuit ("IC") designs increasingly require interface between ICs, or between portions within a single IC, that have different voltage requirements. Level shifting circuits are used to accomplish changing a voltage level of an electronic signal from a first value to a second value.

When shifting from a signal having a smaller voltage to a signal having a higher voltage, many existing level shifting circuits rely at least in part on transistors that have threshold voltages capable of tolerating the full voltage range of the larger voltage signal. Such transistors typically have thicker insulating (e.g., oxide) layers than do transistors in circuits that process the smaller signal. Thicker oxide transistors can tolerate the voltage difference generated by the larger signal. However, use of thicker oxide devices can limit the switching speed of the circuit and hence limit the frequency of signals that the circuit is capable of generating or transmitting. There is therefore a need for level shifting circuits that can utilize transistors having thinner insulating layers to generate signals of a given voltage range.

SUMMARY

An embodiment of the present invention provides clock data recovery circuitry with a high speed level shifting circuit that uses an input signal to generate two intermediate signals and uses the intermediate signals to generate an output signal. The output signal has a higher voltage than the input signal.

One embodiment includes a first driver and second driver coupled in parallel to provide intermediate signals to an output driver. In a particular aspect, individual transistors of the output driver are subject to gate-to-source, gate-to-drain, and source-to-drain voltages that are less than the peak-to-peak amplitude of the output signal.

In one embodiment, the first driver includes an n-channel metal oxide semiconductor ("NMOS") cascode circuit, the second driver includes a p-channel metal oxide semiconductor ("PMOS") cascode circuit, and the output driver includes a complementary metal oxide conductor ("CMOS") cascoded inverter stage. In one embodiment, the level shifter is implemented in an IC characterized by 45-nanometer technology.

In another embodiment, the second driver includes CMOS inverters and the first driver is coupled to a programmable current select to help select current levels through the driver so that the signal transition time it provides substantially matches the signal transition time of the second driver. In another embodiment, the level shifter is implemented in an IC characterized by 65-nanometer technology.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
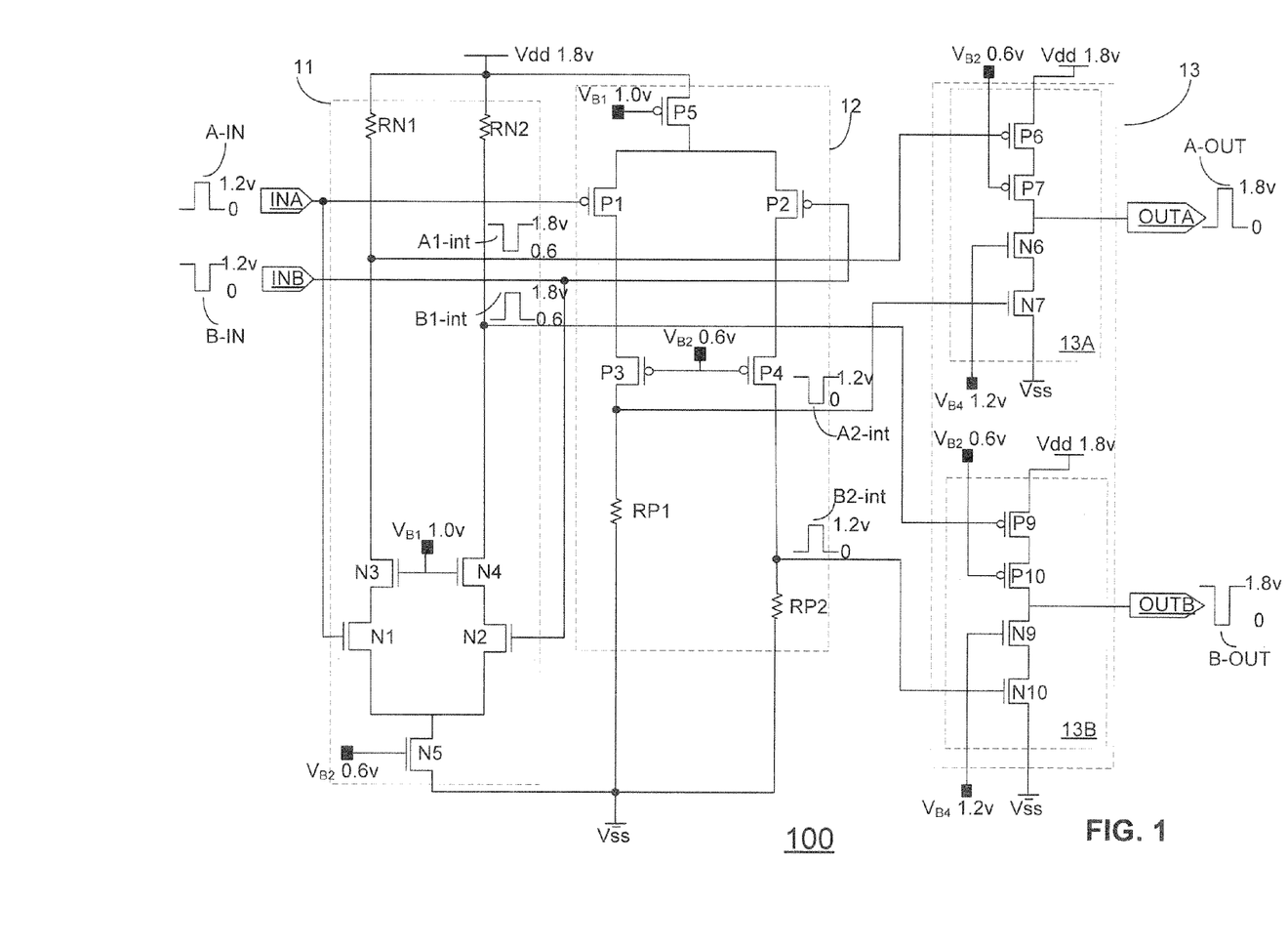
FIG. 1 illustrates an exemplary level shifter in accordance with an embodiment of the present invention.

FIG. 1 illustrates an exemplary level shifter 100 in accordance with an embodiment of the present invention.

Embodiments herein will be illustrated and described in the context of circuits for processing a differential pair of signals. However, those skilled in the art will understand that the principles disclosed are equally applicable to various circuit types, including single-ended circuits.

Level shifter 100 includes inputs INA and INB. Inputs INA and INB receives signals such as signals A-IN and B-IN. Signals A-IN and B-IN are differential counterparts; thus signal B-IN is phase-shifted 180 degrees relative to signal A-IN.

Level shifter 100 also includes outputs OUTA and OUTB. Signals such as signals A-OUT and B-OUT are provided by level shifter 100 at, respectively, OUTA and OUTB. Like signals A-IN and B-IN, signals A-OUT and B-OUT are differential counterparts of each other; thus A-OUT and B-OUT are 180 degrees out of phase. Signals A-IN and B-IN are 1.2 volt ("1.2v") signals. Signals A-OUT and B-OUT are 1.8v signals.

Level shifter 100 further includes first driver 11, second driver 12, and output driver 13 coupled as shown, with drivers 11 and 12 forming parallel stages coupled to the output stage, driver 13.

Driver 11 is a voltage clamping cascode stage. It includes resistors RN1 and RN2 and NMOS transistors N1, N2, N3, N4, and N5 coupled as shown. Transistors N1 and N2 form a differential input pair. Transistors N3 and N4 are coupled to the differential input pair as shown to form a cascode arrangement. Transistors N3 and N4 are coupled to bias voltage $V_{B1}$ (1.0v in this example). Transistor N5 is coupled to bias voltage $V_{B2}$ (0.6v in this example), and serves as a current sink.

Second driver 12 is another voltage clamping cascode stage. It includes resistors RP1 and RP2 and PMOS transistors P1, P2, P3, P4, and P5 coupled as shown. Transistors P1 and P2 form a differential input pair. Transistors P3 and P4 are coupled to the differential input pair as shown to form a cascode arrangement. Transistors P3 and P4 are also coupled to bias voltage $V_{B2}$. Transistor P5 is coupled to bias voltage $V_{B1}$, and serves as a current source.

Output driver 13 includes voltage-clamping cascode CMOS inverters 13A and 13B. Cascode inverter 13A includes PMOS transistors P6 and P7 and NMOS transistors N6, and N7. Transistors P6 and N7 form a single-ended inverter input of the cascoded CMOS inverter output stage. Transistors P7 and N6 are coupled to the input transistors as shown to provide a cascode arrangement. Transistor P7 is coupled to bias voltage $V_{B2}$ and transistor N6 is coupled to bias voltage $V_{B4}$ (1.2v in this example). Cascode inverter 13B includes PMOS transistors P9 and P10 and NMOS transistors N9, and N10. Transistors P9 and N10 form a single-ended inverter input of the cascoded CMOS inverter output stage. Transistors P10 and N9 are coupled to the input transistors as shown to provide a cascode arrangement. Transistor P10 is coupled to bias voltage $V_{B2}$ and transistor N6 is coupled to bias voltage $V_{B4}$.

First driver 11, second driver 12, and output driver 13 are all coupled to a supply voltage Vdd and a ground voltage Vss as shown. In this example, the supply voltage is 1.8v and the ground voltage is 0v.

In this example, signals A-IN and B-IN have low values of 0v and high values of 1.2v. Signals A-OUT and B-OUT have a low values of 0v and a high values of 1.8v. In the illustrated arrangement, level shifter 100 shifts the high value of a signal from 1.2v (signals A-IN and B-IN) to 1.8v (signals A-OUT and B-OUT) without putting a 1.8v voltage stress on the gate-to-source, gate-to-drain, or drain-to-source of the thin oxide transistors as explained further below.

Level shifter 100 uses input signal A-IN to generate two intermediate signals, A1-int and A2-int (driver 11 uses A-IN to generate A1-int and driver 12 uses A-IN to generate A2-int). A1-int and A2-int are substantially similar in shape and in peak-to-peak amplitude (i.e., the difference between the high and low values of the signal), but A1-int ranges from 0.6v to 1.8v while A2-int ranges from 0v to 1.2v. The resistance of resistors RN1 and RN2 and the value of $V_{B2}$ biasing transistor N5's gate are selected such that the low value of signal A1-int remains around 0.6v. Cascoded inverter 13A receives both signal A1-int and signal A2-int. A1-int is received at the gate of PMOS transistor P6 and A2-int is received at the gate of NMOS transistor N7. Circuit 13A combines A1-int and A2-int to generate signal A-OUT, which has the full rail-to-rail voltage from 0v to 1.8v. In this example, A1-int and A2-int are "combined" in the sense that both are used to generate signal A-OUT.

Circuit 13A is arranged as a cascoded inverter. However, as described above, the exact same signal is not fed into both of the inverter's inputs. In this example, signals A1-int and A2-int are different in that one swings from 0.6v to 1.8v and the other swings from 0v to 1.2v. These signals are generated by parallel stages (NMOS driver 11 and PMOS driver 12). In a preferred embodiment, although A1-int and A2-int have different high/low voltage values, phase and shape of these signals (and the phase and shape of their differential counterparts B1-int and B2-int) match as closely as possible (e.g., with respect to shape, have the substantially similar rise/fall times). Also, in this example, the magnitude of the voltage range (i.e., the peak-to-peak amplitude) of each signal (A1-int and A2-int) is substantially similar (about 1.2v).

Circuit 13B uses signals B1-int and B2-int (the differential counterparts of A1-int and A2-int) to generate signal B-OUT (the differential counterpart of A-OUT) in similar fashion. B1-int and B2-int (like A1-int and A2-int) are substantially similar in shape and peak-to-peak amplitude, but B2-int ranges from 0v to 1.2v while B1-int ranges from 0.6v to 1.8v. Cascoded inverter 13B receives both signals, B1-int is received at the gate of PMOS transistor P9 and B2-int is received at the gate of NMOS transistor N10. Circuit 13B utilizes B1-int and B2-int to generate signal B-OUT, which has the full rail to rail voltage from 0v to 1.8v.

In this example, the high/low values of signals A1-int, A2-int, B1-int, and B2-int and the values of $V_{B2}$ and $V_{B4}$ are such that the gate-to-source, gate-to-drain, or drain-to-source voltage stress on any one of the transistors in output driver 13 (i.e., P6, P7, N6, N7, P9, P10, N9, and N10) does not exceed about 1.2v. This allows the use of thinner oxide devices at the output stage than would otherwise be used to drive a 1.8v signal. Also, the resistance value of RN1, RN2, RP1, and RP2 and the value of biases $V_{B1}$, $V_{B2}$, and $V_{B4}$ are selected to keep the stress on the transistors in first driver 11 (i.e., N1, N2, N3, N4 and N5) and second driver 12 (i.e., P1, P2, P3, P4, and P5) from exceeding about 1.2v, In this example, the resistance of each resistor (RN1, RN2, RP1, and RP2) is about 600 ohms ("600Ω").

Level shifter 100 shifts signals to 1.8v and is capable of a data throughput greater than 8-10 gigabits per second ("Gbps"). In a preferred implementation, level shifter 100 shifts signals from 1.2v to 1.8v and allows a data throughput of about 12-16 Gbps. In one embodiment, level shifter 100 is implemented in an IC characterized by 45-nanometer technology. This term refers to an approximate channel length dimension of transistors on the IC.

Figure 2A:
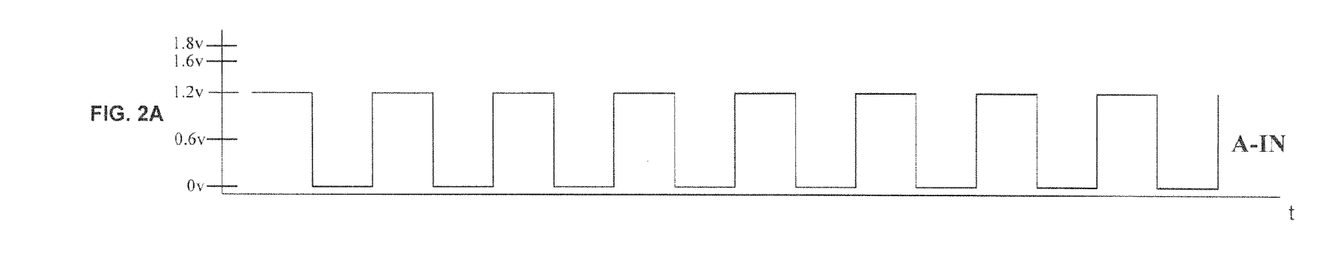
FIGS. 2A-2D illustrates the relationship between input, intermediate, and output signals associated with the embodiment of FIG. 1.
Figure 2B:
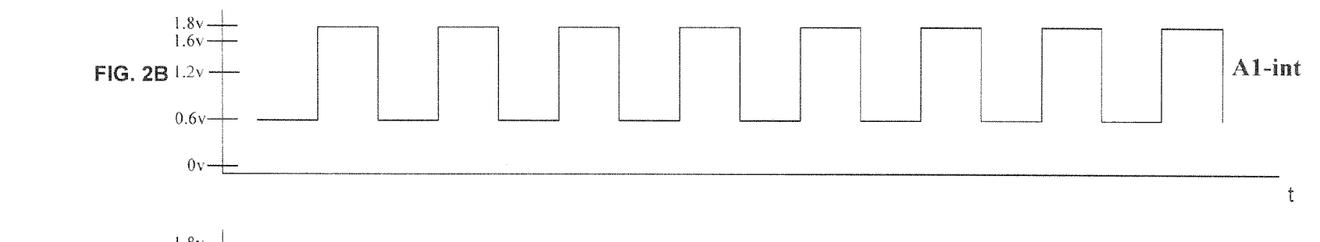
Figure 2C:
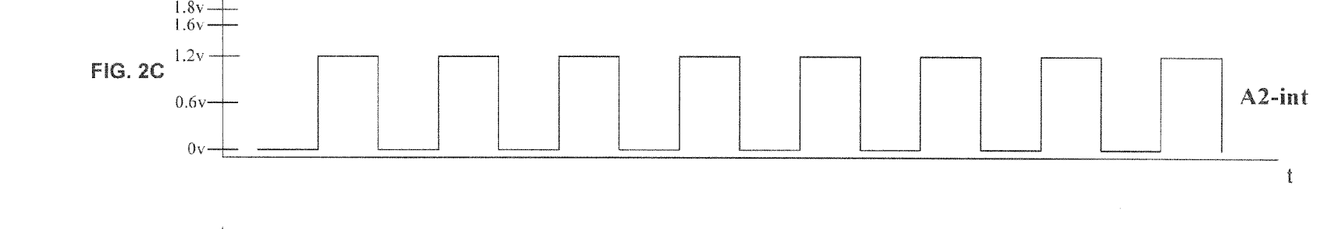
Figure 2D:
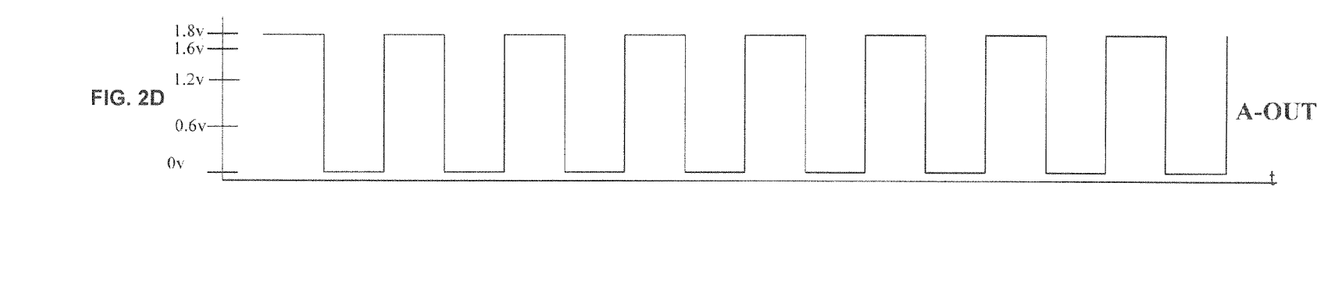

FIGS. 2A-2D illustrates the relationship between idealized versions of signals A-IN, A1-int, A2-int, and A-OUT. As shown in FIG. 2A, signal A-IN ranges from 1.2v to 0v. As shown in FIG. 2B, intermediate signal A1-int ranges from 0.6v to 1.8v. As shown in FIG. 2C, intermediate signal A2-int ranges from 0v to 1.2v. As shown in FIG. 2D, output signal A-OUT has a voltage range from 0v to 1.8v. In this embodiment, intermediate signals A1-int and A2-int each have voltage value ranges that cover a portion, but not the entire range, of the voltage range of output signal A-OUT. In one embodiment, signals A1-int and A2-int have substantially similar phase, transition times, and peak-to-peak amplitude (i.e. difference between high and low voltage values).

Signals B-IN, B1-int, B2-int, and B-OUT are simply the differential counterparts to the signals illustrated in FIGS. 2A-2D. Thus they are not separately illustrated.

Figure 3:
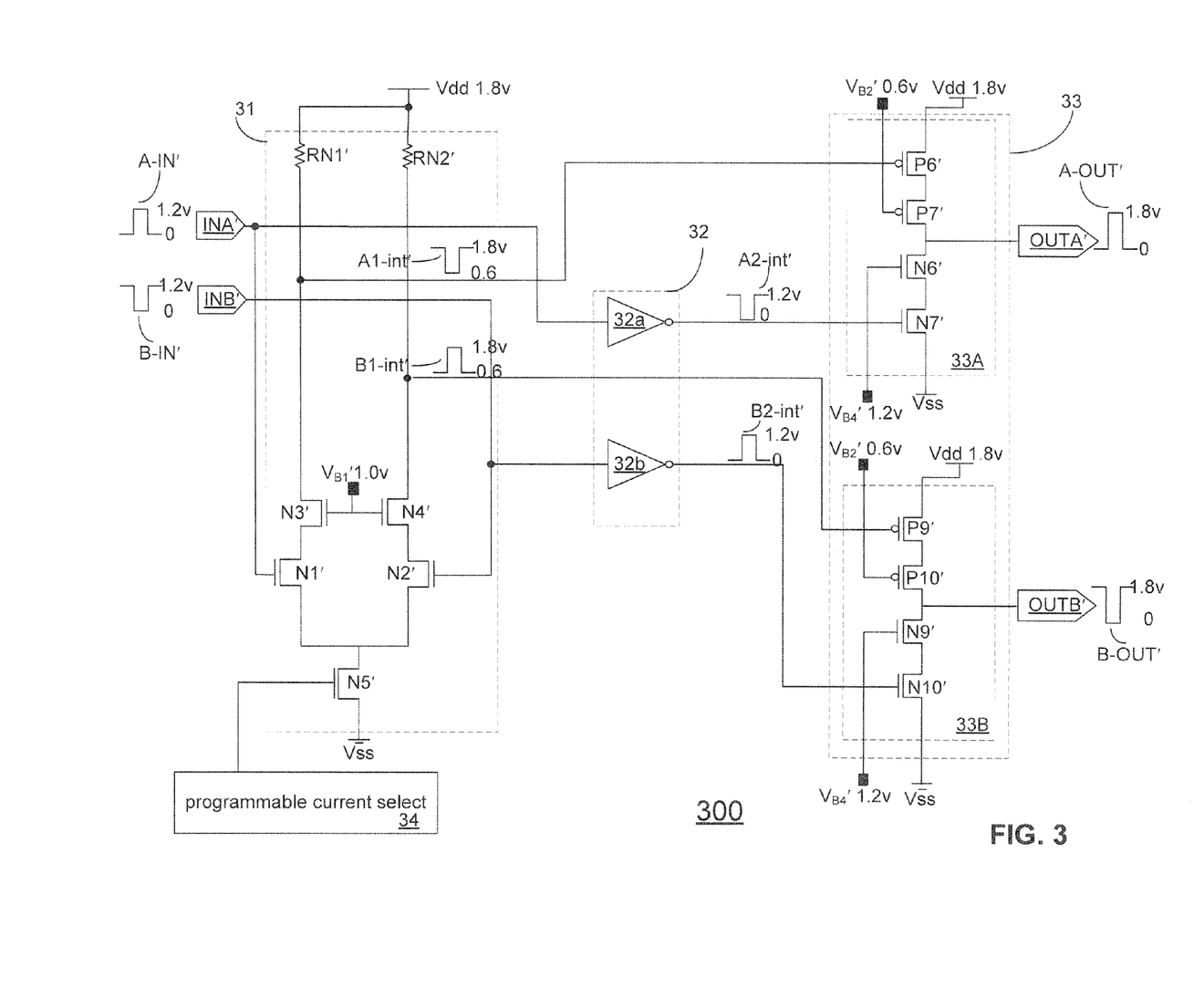
FIG. 3 illustrates an exemplary level shifter in accordance with an alternative embodiment of the present invention.

FIG. 3 illustrates an exemplary level shifter 300 in accordance with an alternative embodiment of the present invention.

Level shifter 300 includes inputs INA' and INB' for receiving signals such as A-IN' and B-IN'.

Level shifter 300 also includes outputs OUTA' and OUTB'. Signals such as A-OUT' and B-OUT' are provided by level shifter 300 at, respectively, OUTA' and OUTB'.

Level shifter 300 further includes first driver 31, second driver 32, and output driver 33.

First driver 31 is similar to driver 11 of the embodiment of FIG. 1. Driver 31 includes resistors RN1' and RN2' and NMOS transistors N1', N2', N3', N4', and N5' coupled as shown. Transistors N1' and N2' form a differential input pair. Transistors N3' and N4' are coupled to the differential input pair as shown to form a cascode arrangement. Transistors N3' and N4' are coupled to bias voltage $V_{B1}$' (1.0v in this example). Transistor N5' is coupled to programmable current select 34 and serves as a current sink.

Output driver 33 is similar to output driver 13 of FIG. 1 and includes cascode CMOS inverters 33A and 33B. Cascoded inverter 33A includes PMOS transistors P6' and P7' and NMOS transistors N6', and N7'. Transistors P6' and N7' form a single-ended inverter input of the cascoded CMOS inverter output stage. Transistors P7' and N6' are coupled to the input transistors as shown to provide a cascode arrangement. Transistor P7' is coupled to bias voltage $V_{B2}$' (0.6v in this example) and transistor N6' is coupled to bias voltage $V_{B4}$' (1.2v in this example). Cascoded inverter 33B includes PMOS transistors P9' and P10' and NMOS transistors N9', and N10'. Transistors P9' and N10' form a single-ended inverter input of the cascoded CMOS inverter output stage. Transistors P10' and N9' are coupled to the input transistors as shown to provide a cascode arrangement. Transistor P10' is coupled to bias voltage $V_{B2}$' and transistor N6' is coupled to bias voltage $V_{B4}$'.

In this embodiment, second driver 32 includes two standard CMOS inverters 32a and 32b coupled in parallel. Inverters 32a and 32b are driven by a 1.2v supply voltage and are coupled to ground (connections to supply voltage and ground not separately shown). First driver 31 and output driver 33 are coupled to a supply voltage Vdd (1.8v) and a ground voltage Vss (0v) as shown.

Level shifter 300, like level shifter 100, shifts signals from a 1.2v input signal to a 1.8v output signal. Like level shifter 100, level shifter 300 utilizes intermediate signals generated from the input signal to generate the output signal. A1-int' and A2-int' are substantially similar phase, transition times, and peak-to-peak amplitude (i.e. difference between high and low voltage values), but A1-int' ranges from 0.6v to 1.8v while A2-int' ranges from 0v to 1.2v. In this example, the voltage provided from programmable current select 34 to bias the gate of transistor N5' and the resistance of resistors RN1' and RN2' are selected such that the low value of signal A1-int' remains around 0.6v. In this example, the resistance of each resistor (RN1' and RN2') is about 600Ω.

Cascoded inverter 33A receives both signal A1-int' and signal A2-int'. A1-int' is received at the gate of PMOS transistor P6' and A2-int' is received at the gate of NMOS transistor N7'. Circuit 33A combines A1-int' and A2-int' to generate signal A-OUT, which has the full rail-to-rail voltage from 0v to 1.8v. A1-int' and A2-int' are "combined" in the sense that both are used to generate signal A-OUT.

Cascoded inverter 33B uses signals B1-int' and B2-int' (the differential counterparts of A1-int' and A2-int') to generate signal B-OUT' (the differential counterpart of A-OUT') in similar fashion. B1-int' and B2-int' (like A1-int' and A2-int') have substantially similar phase, transition time, and peak-to-peak amplitude, but B1-int' ranges from 0.6v to 1.8v while B2-int' ranges from 0v to 1.2v. Cascoded inverter 33B receives both signals. B1-int' is received at the gate of PMOS transistor P9' and B2-int' is received at the gate of NMOS transistor N10'. Circuit 33B utilizes B1-int' and B2-int' to generate signal B-OUT', which has the full rail-to-rail voltage from 0v to 1.8v.

In a preferred embodiment, although A1-int' and A2-int' have different voltage values, the phase, transition times, and peak-to-peak amplitude of these signals (and the phase, transition times, and peak-to-peak amplitude of their differential counterparts B1-int' and B2-int') match as closely as possible. To facilitate this, first driver 31 is coupled to programmable current select 34. In this context, particular process, voltage, and temperature ("PVT") variations might result in first driver 31 and second driver 32 having slightly different performance characteristics which in turn might result in intermediate signals that have slightly different transition times (i.e. rise/fall times). For example, upon initial operation, if driver 31 is generating signals with slightly slower transition times than signals generated by second driver 32, then programmable current select 34 can be programmed to provide a slightly higher voltage to the gate of transistor N5', thereby increasing the current through driver 31 and increasing the rise/fall time of intermediate signal strands A1-int' and A2-int'. Also, although A1-int' and A2-int' have different voltage ranges, in this example they have a substantially similar peak-to-peak amplitude of 1.2v.

In this example, the high/low values of signals A1-int', A2-int', B1-int', and B2-int' and the values of $V_{B2}$' and $V_{B4}$' are chosen so that the voltage stress on any one of the transistors in output driver 33 (i.e., P6', P7', N6', N7', P9', P10', N9', and N10') does not exceed about 1.2v. This allows the use of thinner oxide devices than would otherwise be used to drive a 1.8v signal. Also, the resistance of resistors RN1' and RN2', the value of bias $V_{B1}$' and the value of the voltage bias provided by programmable current select 34 are chosen to keep the stress on the transistors in first driver 31 (i.e., N1', N2', N3', N4', and N5') from exceeding about 1.2v.

In a preferred implementation, level shifter 300 shifts signals from 1.2v to 1.8v and is capable of a data throughput of 12-16 Gbps. In one embodiment, level shifter 300 is implemented in an IC characterized by 65-nanometer technology.

Figure 4:
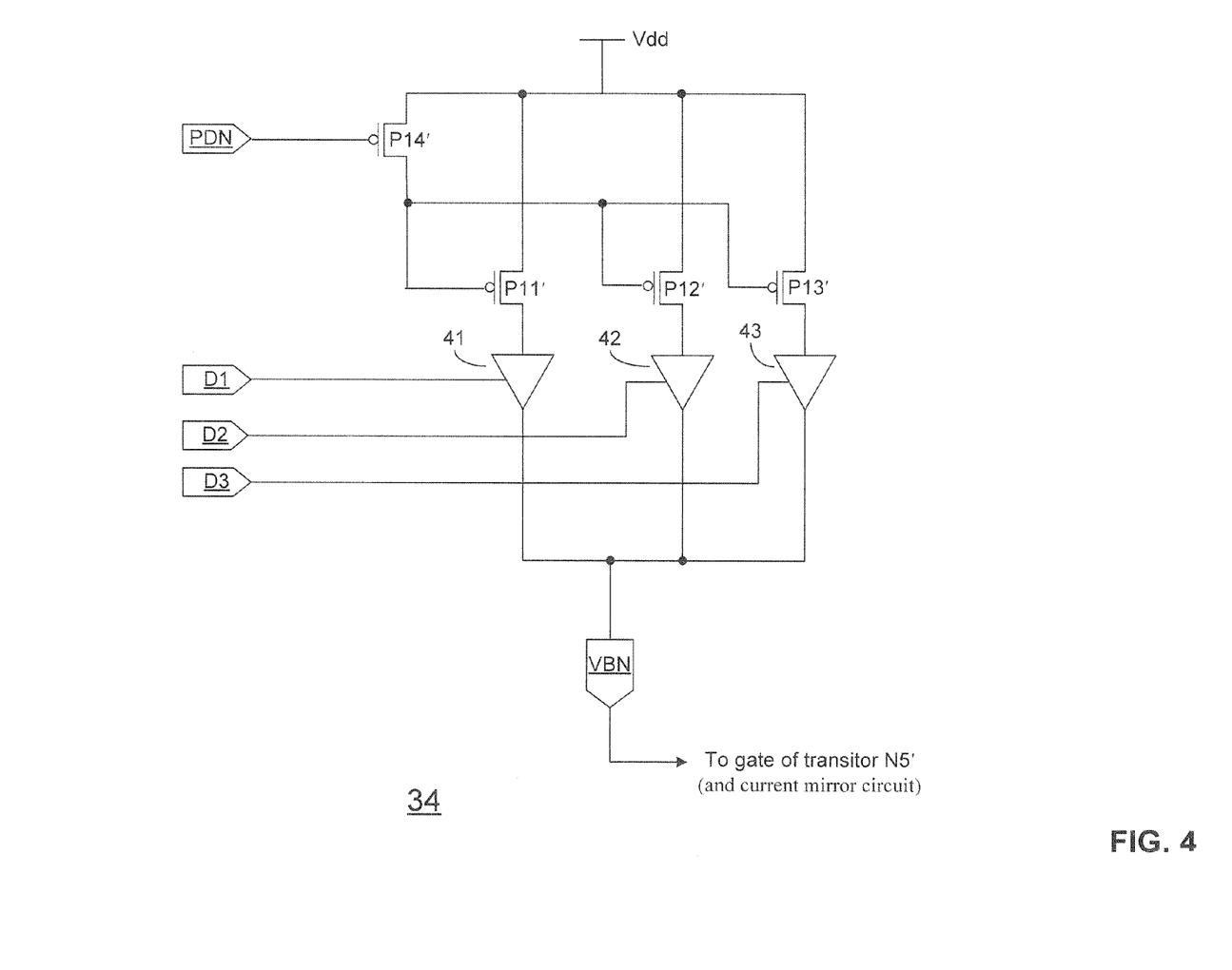
FIG. 4 shows further details of the current select circuit of the embodiment of FIG. 3.

FIG. 4 illustrates further details of the programmable current select 34 of the embodiment of FIG. 3. Programmable current select 34 comprises transistors P11', P12', P13', and P14' and tri-state buffers 41, 42, and 43. Tri-state buffers 41, 42, and 43 are controlled by programming data provided, respectively, at data inputs D1, D2, and D3. Transistor P14' is controlled by the signal received at input PDN. When transistor P14' is on, then transistors P11', P12', and P13' are also on and the current provided to output VBN depends upon how many of tri-state buffers 41, 42, and 43 are on. This allows three different current levels to be programmably provided to output VBN. The voltage at VBN is provided to a current mirror (current mirror not separately shown) and is provided to the gate of transistor N5' of driver 31 of FIG. 3. This allows programmable control of the current through that transistor and hence through driver 31. In one embodiment, programmable current select 34 allows selection between the following current levels through transistor N5': 125 μA, 150 μA, 175 μA. Those skilled in the art will recognize that, in alternative embodiments, a greater or lesser number of current options may be provided with a greater or lesser level of granularity. Programming data is provided to select the appropriate current level so that the transition times of signals A1-int' and A2-int' (as well as B1-int' and B2-int') match as closely as possible. In a preferred embodiment, the possible current choices are within a narrow enough range such that the low value of signals A1-int' and B1-int' do not deviate significantly from 0.6v. Fine tuning currents within such a range allows a preferred matching of the transition times (and hence the shape) of signal A1-int' to that of A2-int' (and a similar shape-matching of signal B1-int' to signal B2-int').

Figure 5:
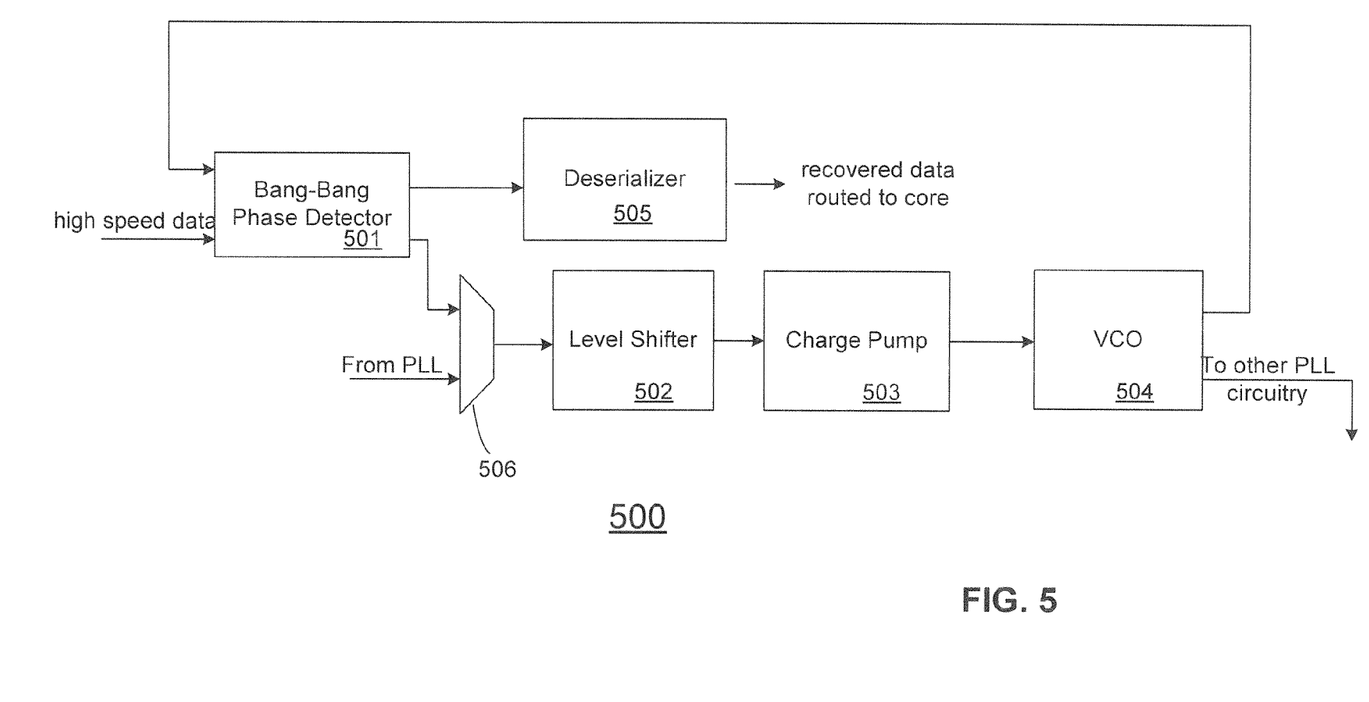
FIG. 5 is a high-level block diagram of a clock data recovery circuit including a level shifter in accordance with an embodiment of the present invention.

FIG. 5 illustrates a high-level block diagram of a clock data recovery circuit ("CDR") 500 in which an embodiment of the present invention might be implemented. CDR 500 receives high speed data signals from a receiver circuit (no separately shown) and provides recovered data suitable for routing to the core of a chip such as a programmable logic device or other integrated circuit.

CDR 500 includes bang-bang phase detector 501, deserializer 505, level shifter 502, charge pump 503, and voltage control oscillator ("VOC") 504 all coupled as shown. As will be appreciated by those skilled in the art, certain elements of CDR 500 are also commonly used in phase-locked loops ("PLLs"). In particular, level charge pumps and VCOs are well known PLL elements. Therefore, in this example, mux 506 allows selection between output from other PLL circuitry (other PLL circuitry not separately shown) and bang-bang phase detector 501 to provide input to level shifter 502. This allows level shifter 502, charge pump 503, and VOC 504 to be used by either CDR 500 or by a PLL (PLL not separately shown).

When CDR 500 is needed, mux 506 is programmed to select output from bang-bang phase detector 501 to provide input to level shifter 502. As will be appreciated by those skilled in the art, the input signals to level shifter 502 are based on a phase difference between data signals provided to one input of bang-bang phase detector 501 and clock feedback signals provided from VCO 504 to the other input of bang-bang phase detector 501.

Bang-bang phase detector 501 is processing high speed data with, in one example, a data throughput of about 10 Gbps. Bang-bang phase detector 501 provides 1.2v signals to level shifter 502 which in turn provides 1.8v signals to charge pump 503. Level shifter 502 is in accordance with an embodiment of the present invention and can shift the signals from 1.2v signals to 1.8v signals while maintaining a high throughput. In a preferred implementation, level shifter 502 shifts signals from 1.2v to 1.8v and allows a throughput of 12-16 Gbps.

A CDR circuit including a level shifter embodying the present invention might be included in a variety of ICs, including ICs that are programmable logic devices. Programmable logic devices ("PLDs") (also sometimes referred to as complex PLDs ("CPLDs"), programmable array logic ("PALs"), programmable logic arrays ("PLAs"), field PLAs ("FPLAs"), erasable PLDs ("EPLDs"), electrically erasable PLDs ("EEPLDs"), logic cell arrays ("LCAs"), field programmable gate arrays ("FPGAs"), or by other names) are well known ICs that provide the advantages of fixed ICs with the flexibility of custom ICs. Such devices are well known in the art and typically provide an "off the shelf" device having at least a portion that can be programmed to meet a user's specific needs. Application specific ICs ("ASICs") have traditionally been axed ICs, however, it is possible to provide an ASIC that has a portion or portions that are programmable; thus, it is possible for an IC device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a' look-up table ("LUT") or product term, carry-out chain, register, and other elements, LABs (comprising multiple LEs) may be connected to horizontal and vertical lines that may or may not extend the length of the PLD.

PLDs have configuration elements that may be programmed or reprogrammed. Configuration elements may be realized as random access memory ("RAM") bits, flip-flops, electronically erasable programmable read-only memory ("EEPROM"), or other memory elements. Placing new data into the configuration elements programs or reprograms the PLD's logic functions and associated routing pathways. Configuration elements that are field programmable are often implemented as RAM cells (sometimes referred to as "CRAM" or "configuration RAM"). However, many types of configurable elements may be used including static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications.

A level shifter in accordance with the present invention may implemented in a PLL or in another portion of a PLD or in another type of IC. It might also be implemented at the interface between two or more ICs.

Figure 6:
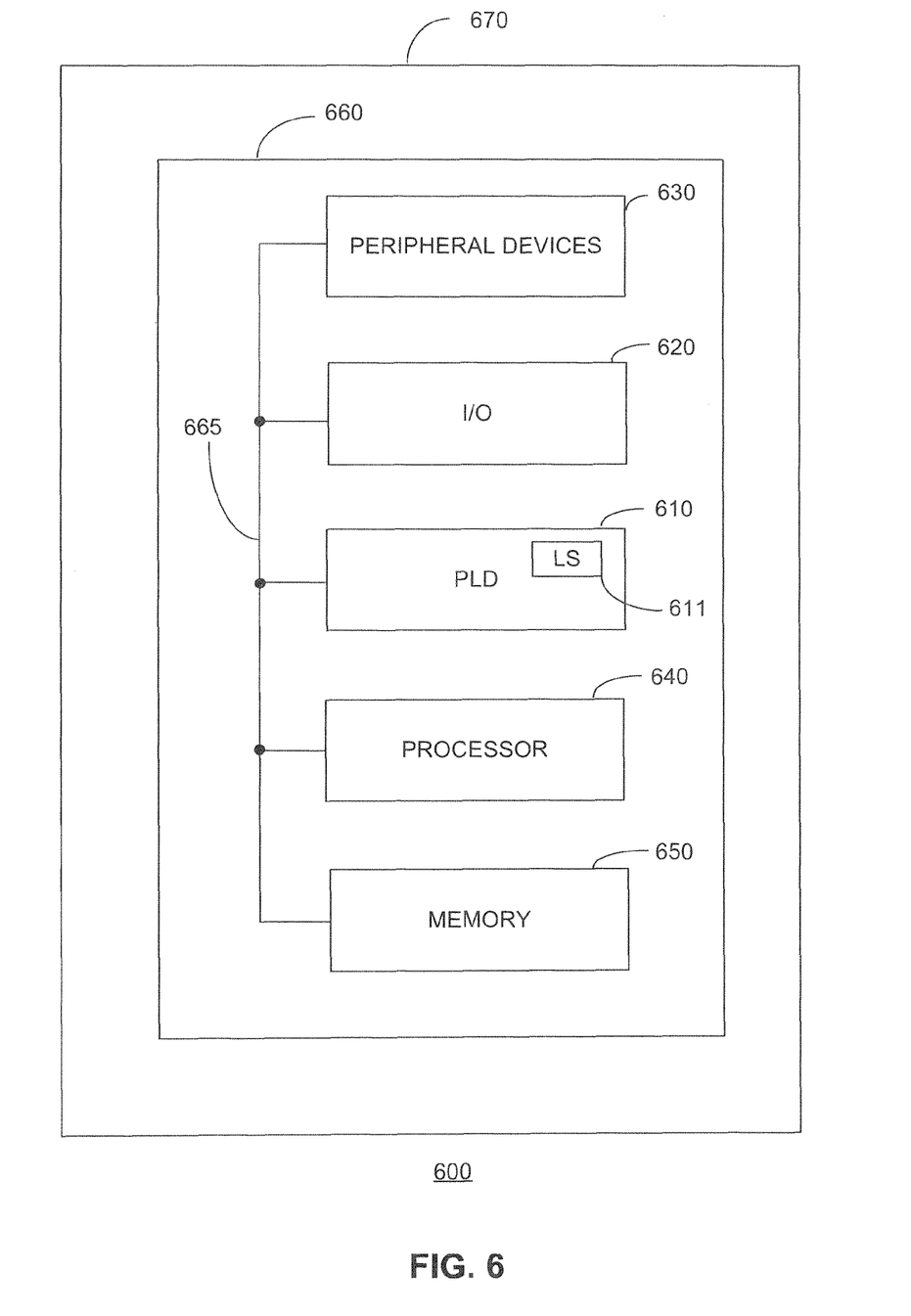
FIG. 6 illustrates a programmable logic device including a level shifter in accordance with an embodiment of the present invention implemented in a data processing system.

FIG. 6 illustrates a PLD 610 including a level shifter 611 in accordance with an embodiment of the present invention. FIG. 6 further illustrates PLD 610 implemented in a data processing system 600. Data processing system 600 may include one or more of the following components: a processor 640; memory 650; I/O circuitry 620; and peripheral devices 630. These components are coupled together by a system bus 665 and are populated on a circuit hoard 660 which is contained in an end-user system 670. A data processing system such as system 600 may include a single end-user system such as end-user system 670 or may include a plurality of systems working together as a data processing system.

System 600 can be used in a wide variety of applications, such as computer networking, data networking, instrumentation, video processing, digital signal processing, or any other application where the advantage of using programmable or reprogrammable logic in system design is desirable. PLD 610 can be used to perform a variety of different logic functions. For example, programmable logic device 610 can be configured as a processor or controller that works in cooperation with processor 640 (or, in alternative embodiments, a PLD might itself act as the sole system processor). PLD 610 may also be used as an arbiter for arbitrating access to shared resources in system 600. In yet another example, PLD 610 can be configured as an interface between processor 640 and one of the other components in system 600. It should be noted that system 600 is only exemplary.

In one embodiment, system 600 is a digital system. As used herein a digital system is not intended to be limited to a purely digital system, but also encompasses hybrid systems that include both digital and analog subsystems.

Although particular embodiments have been described in detail and certain variants have been noted, various other modifications to the embodiments described herein may be made without departing from the spirit and scope of the present invention, thus, the invention is limited only by the appended claims.

What is claimed is:

1. Circuitry in a clock data recovery circuit comprising:
a phase detector, a level shifter, and a charge pump coupled such that the phase detector provides signals to the level shifter and the level shifter provides signals to the charge pump;
wherein a ratio of a voltage of the signals provided by the level shifter and a data throughput of the level shifter is substantially equal to or less than 1.8v/10 Gbps.

2. A programmable logic device comprising a clock data recovery circuit including the circuitry of claim 1.

3. A data processing system comprising the programmable logic device of claim 2.

4. The circuitry of claim 1 wherein the level shifter comprises:
first and second drivers coupled to receive a differential input signal and generate first and second differential intermediate signals from the input signal, at least one of the first and second drivers including a differential transistor pair; and an output driver coupled to use the intermediate signals to provide a differential output signal, the output signal having a greater peak-to-peak amplitude than the input signal.

5. The circuitry of claim 1 wherein the level shifter comprises:
first and second drivers coupled to receive an input signal and generate first and second intermediate signals from the input signal; and
an output driver coupled to use the intermediate signals to provide an output signal, the output signal having a greater peak-to-peak amplitude than the input signal wherein:
the first driver is an NMOS stage;
the first driver includes resistors and a current sink transistor;
the current sink transistor is coupled to a bias voltage; and
a resistance of the resistors and a value of the bias voltage are selected to control current and voltages in the first driver such that a low value of the first intermediate signal is greater than a low value of the input signal.

6. The circuitry of claim 1 wherein the level shifter comprises:
first and second drivers coupled to receive an input signal and generate first and second intermediate signals from the input signal; and
an output driver coupled to use the intermediate signals to provide an output signal, the output signal having a greater peak-to-peak amplitude than the input signal wherein:
the second driver is a PMOS stage;
the second driver further includes resistors and a current source transistor;
the current source transistor is coupled to a bias voltage; and
a resistance of the resistors and a value of the bias voltage are selected to control current and voltages in the second driver such that a high value of the second intermediate signal is less than a level of a source voltage powering the second driver.

* * * * *